United States Patent [19]
Moyal et al.

[11] Patent Number: 5,412,594
[45] Date of Patent: May 2, 1995

[54] FUSE TRIMMING IN PLASTIC PACKAGE DEVICES

[75] Inventors: Miki Moyal; Thomas Brennan; Gene Vance, all of Austin, Tex.

[73] Assignee: Advanced Micro Devices, Inc., Sunnyvale, Calif.

[21] Appl. No.: 287,214

[22] Filed: Aug. 8, 1994

Related U.S. Application Data

[62] Division of Ser. No. 149,191, Nov. 8, 1993, Pat. No. 5,384,727.

[51] Int. Cl.[6] .............................................. G11C 13/00
[52] U.S. Cl. ..................................... 365/96; 365/196; 365/201; 365/225.7
[58] Field of Search ............ 365/96, 196, 201, 189.07, 365/225.7

[56] References Cited

U.S. PATENT DOCUMENTS 5,293,564  3/1994  Sukegawa et al. ............ 365/225.7 X
5,359,559 10/1994  Nomura et al. ............... 365/225.7 X

*Primary Examiner*—Do Hyun Yoo
*Attorney, Agent, or Firm*—Foley & Lardner

[57] ABSTRACT

A method and apparatus provide fuse trimming or analog integrated circuit parameters in plastic packages. The apparatus includes an electrically interruptible circuit element, such as a fuse; a level reading unit which reads the state of the electrically interruptible circuit element and generates a code in response to the state; a state altering unit, such as a current source for providing a blow current; and a control circuit. A test level reading device allows screening for marginally-blown fuses. A switchable element removes applied voltage from fuses when the fuse is not being blown or read to prevent fuse regrowth.

7 Claims, 3 Drawing Sheets

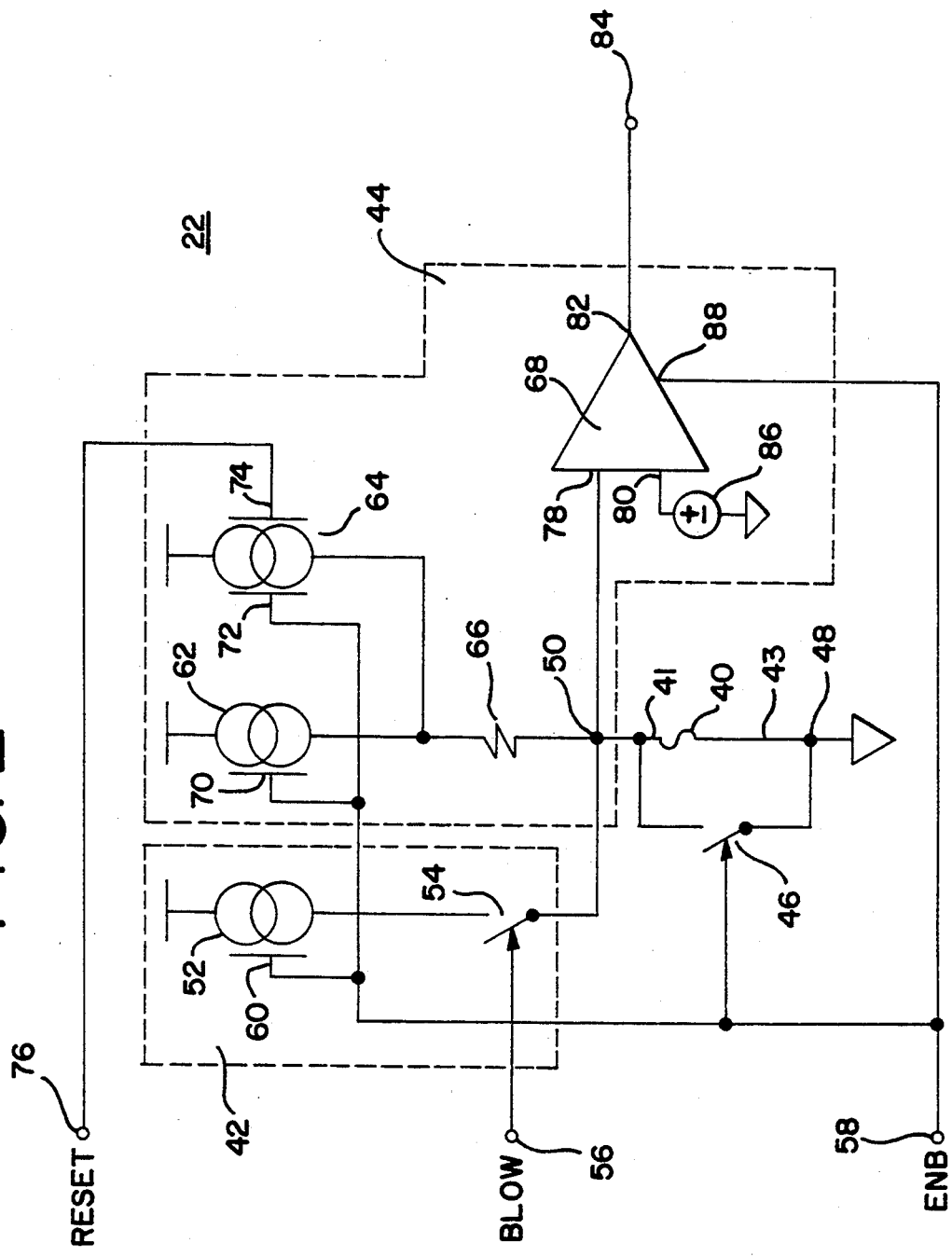

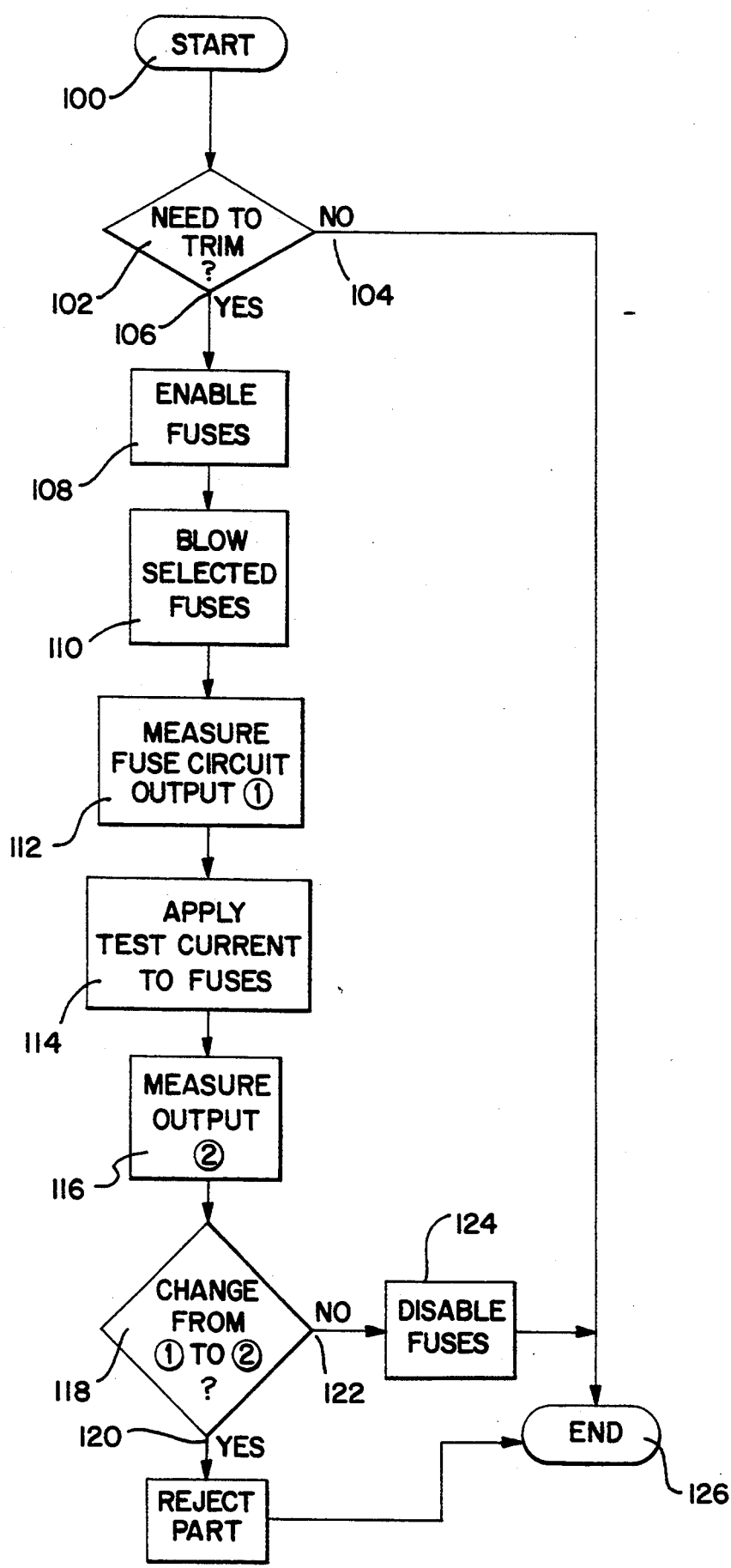

FUSE TRIMMING IN PLASTIC PACKAGE DEVICES

This is a divisional application of application Ser. No. 08/149,191, filed on Nov. 8, 1993, now U.S. Pat. No. 5,384,727, issued on Jan. 24, 1995.

BACKGROUND OF THE INVENTION

The present invention relates to a form of non-volatile memory in integrated circuits which can be programmed before or after encapsulation in any type of package. More particularly, the present invention relates to the use of on-chip circuitry for blowing fuses for precision trimming analog integrated circuits encapsulated in plastic package devices.

It is well known in the art of integrated circuit design to use one or more fuses, in conjunction with other fuses and circuit elements, to set a circuit parameter such as a voltage, a current, or a voltage or current gain. Fuses generally have an intact, or uninterrupted, state and a blown, or interrupted, state. In the intact state, the fuse is a low resistance element capable of conducting current. In the blown state, the fuse has a very high resistance and generally does not conduct current. When used in conjunction with other circuit elements to set a circuit parameter, the fuse may be configured so that its intact state corresponds to a first value of the circuit parameter, and its blown state corresponds to a second value of the circuit parameter.

Fuse trimming circuits are commonly used in analog integrated circuit devices. Such analog integrated circuits may include digital signal processors, telecommunications devices, and operational amplifiers. In analog integrated circuits, it is often desirable to precisely trim circuit parameters to a predetermined range of values. While analog integrated circuits may be designed to produce such parameters within a certain range of values, variations in manufacturing processes may produce an unacceptably wide tolerance level for parameters after manufacturing. Accordingly, it is well known to use fuse trimming to improve the tolerance range of analog integrated circuit parameters for high performance applications.

In prior art devices, fuses have been fabricated on the surface of an integrated circuit device directly adjacent to and in electrical connection with a large area of metal known as a probe pad. The fuse is fabricated from one of the conductor layers used in the integrated circuit device, such as a metal layer or a low-resistance polysilicon layer. As is well known in the art, the fuse is formed of a narrow strip of the conductor layer. When the current through the fuse exceeds a predetermined amount, the fuse "blows" by interrupting the strip of conductor layer. The final passivation layers of the integrated circuit device must be removed from the probe pad to allow direct contact with the probe pad by a probe.

As noted, a first end of the fuse is in electrical contact with the probe pad, and a second end of the fuse is electrically connected to another node on the integrated circuit device, such as ground. In such prior art devices, the first end of the fuse is also connected through a resistor to a second circuit node, such as the most positive potential in the circuit, or VCC. This first end of the fuse is also connected to circuitry for sensing the voltage present at the first end of the fuse and generating a desired circuit parameter. With the low resistance fuse intact, and with power supplied to the integrated circuit, the first end of the fuse will be pulled to the same potential as the second end of the fuse, or ground. Current will flow through the resistor from VCC, causing a potential drop across the resistor.

In response to the VCC level present at the first end of the fuse, the circuitry coupled to the first end will generate a circuit parameter such as a current or voltage having a first value. When it is determined that this first value is outside of a predetermined range of values, the fuse will be blown. To blow the fuse, a probe contacts the probe pad and supplies sufficient voltage and current across the fuse to cause the fuse to blow, converting from its intact state to its blown state. With the fuse in its blown state, no current flows through the fuse, and the resistor serves as a pull-up resistor, pulling the potential at the first end of the fuse to VCC. When the circuitry coupled to the first end of the fuse detects the VCC potential, the circuitry produces the circuit parameter at a second value.

Because of the need to contact the probe pad with a probe, fuse trimming by blowing one or more fuses must occur at the wafer sort step in the manufacturing process for the integrated circuit device. At wafer sort, the wafers containing the completed integrated circuit devices are contacted with probes to determine functionality of each of the integrated circuit devices. Nonfunctional devices are marked and rejected. Also at wafer sort, predetermined circuit parameters, such as voltages and currents, are measured. In response to the measured circuit parameter, and in accordance with a predetermined program of instructions, one or more fuses on the integrated circuit device may be blown to shift the measured circuit parameter to a preferred value. After wafer sort, nonfunctional chips are discarded and functional chips are packaged for further testing.

In many applications, it is preferable to package integrated circuit devices in plastic packages. Plastic packages are lighter, less expensive and less bulky than alternative packages, such as ceramic packages. However, the manufacturing process by which an integrated circuit device is encapsulated in a plastic package causes circuit parameters to change significantly in the completed, packaged device. The plastic packaging process causes plastic stress, including mechanical and thermal stresses, which varies circuit parameters. From statistical samples taken from a large number of integrated circuit devices, both before and after plastic packaging, it is known that both the mean and the standard deviation of the statistical distribution of the measured circuit parameters will vary as a result of the plastic packaging process.

One solution to this shift in the statistical distribution of measured parameters has been reverse trimming. Where a parameter, such as a voltage gain, is known to shift by a predetermined amount as a result of plastic packaging, the parameter can be reverse trimmed at wafer sort to accommodate the known shift due to plastic packaging.

However, reverse trimming also has its limitations. First, the statistical distribution shift due to plastic packaging is not always constant. As a result, circuit parameters may be overtrimmed or undertrimmed, either of which can cause yield loss. Also, the standard deviation in the statistical distribution of circuit parameters increases following plastic stress due to the plastic packaging process, also causing yield loss.

A further problem encountered during fuse trimming results from marginally-blown fuses. A fuse in its intact state has a very low resistance, such as 200 ohms. A normally-blown fuse has a very high resistance, such as 20 megohms. These values are sufficiently different that associated circuitry can readily discriminate the intact state of the fuse from the blown state of the fuse. However, it is known that some fuses will not fully blow, but assume a marginally-blown state where the fuse resistance is on the order of 10K ohms. The marginally-blown state may result from one or more remaining filaments of fuse material.

Marginally-blown fuses are problematical since it is known that marginally-blown fuses may permit fuse re-growth to occur. In prior art fuse trimming circuits, as described above, a voltage is maintained across the blown fuse during normal operation of the integrated circuit. The pull-up resistor couples the first end of the fuse to VCC, and the second end of the fuse remains at ground potential. Where the fuse is marginally blown, the presence of this potential difference is known to cause the fuse to grow back and reassume a low resistance, intact state. As a result of this fuse regrowth, the circuitry which detects the intact or blown state of the fuse may incorrectly detect an intact state for a regrown fuse, causing a circuit parameter to be set to an incorrect value.

Accordingly, it is an advantage of the present invention to provide fuse trimming in integrated circuit devices which have been packaged in plastic integrated circuit packages. However, the invention can also support fuse trimming before encapsulation just as easily.

It is a further advantage of the present invention to provide for blowing on-chip fuses using only on-chip circuitry.

It is a still further advantage of the present invention to eliminate inaccuracies in circuit parameters generated by fuse trimming circuits by eliminating fuse regrowth.

It is a still further advantage of the present invention to test for marginally-blown fuses in order that integrated circuit devices having such marginally-blown fuses can be rejected as not fully functional devices.

Further advantages and features of the present invention will be apparent from the following specification and claims when considered in connection with the accompanying drawings illustrating the preferred embodiment of the present invention.

SUMMARY OF THE INVENTION

The invention provides an apparatus for use with an electrical circuit including a plurality of circuit elements. The plurality of the circuit elements are arranged for switchable electrical coupling of at least one respective circuit element of the plurality of circuit elements within the circuit. At least one respective circuit element is responsive to a code to electrically include the at least one respective circuit element within the circuit when the code has a first value and to electrically exclude the at least one respective circuit element from the circuit when the code has a second value. The apparatus comprises an electrically interruptible circuit element which establishes a potential at a locus within the apparatus, the potential being at a first potential level when the interruptible circuit element is in an interrupted state and the potential being at a second potential level when the interruptible circuit element is in a noninterrupted state. The apparatus further comprises a level reading unit operatively connected with the interruptible circuit element, the level reading unit generating the code at one value of the first value and the second value when the potential is at the first potential level, the level reading unit generating the code at the other value of the first value and the second value when the potential is at the second potential level. The apparatus further comprises a state altering unit operatively connected with the interruptible circuit element and being configured to change the interruptible circuit element from the noninterrupted state to the interrupted state in response to a first control signal. The apparatus further comprises a control circuit operatively connected with the state altering unit and generating the first control signal.

The invention further provides an apparatus for use with an electrical circuit including a plurality of circuit elements, the plurality of circuit elements including a plurality of switching means for selectively coupling a plurality of circuit branches to an output node in response to a plurality of activation signals. Each respective switching element of the plurality of switching elements couples an associated respective circuit branch of the plurality of circuit branches with the output node when an associated activation signal of the plurality of activation signals has a first value and each respective switching element decouples the associated respective circuit branch from the output node when the associated activation signal has a second value. The apparatus comprises interrupting means for interrupting a circuit, the interrupting means establishing a potential at a node within the apparatus, the interrupting means having an interrupted state for establishing the potential on a first potential level and an uninterrupted state for establishing the potential at a second potential level. The apparatus further comprises sensing means operatively connected with the interrupting means for sensing the potential and generating a code having one value of a first value or a second value when the potential is at the first potential level, the sensing means generating the code at the other value of the first value and the second value when the potential is at the second potential level. The apparatus further comprises state altering means operatively connected with the interrupting means for changing the interrupting means from the uninterrupted state to the interrupted state in response to a first control signal. The apparatus further comprises control means operatively connected with the state altering means for generating the first control signal. The apparatus still further comprises decoder means operatively connected with the sensing means for receiving the code from the sensing means and generating the plurality of activation signals.

The invention still further provides a method for selectively coupling at least one of a plurality of circuit branches with an output node, each respective circuit branch of the plurality of circuit branches including a respective switching element of a plurality of switching elements, the respective switching element being responsive to a respective activation signal of a plurality of activation signals to electrically couple each respective circuit branch with the output node. Each respective switching element couples the respective circuit branch with the output node when the respective activation signal has a first value, and each respective switching element decouples the respective circuit branch from the output node when the respective activation signal has a second value. The method comprises the steps of providing an electrically interruptible circuit element which establishes a potential at a locus, the potential being at a first potential level when the interruptible circuit element is in an interrupted state and the potential being at a second potential level when the interruptible circuit element is in a noninterrupted state. The method further comprises the step of detecting the potential at one of the first potential level or the second potential level, and generating the code at one value of a first value and a second value when the potential is at the first potential level, and generating the code at the other value of the first value and the second value when the potential is at the second potential level. The method still further comprises the step of decoding the code to generate the plurality of activation signals.

DETAILED DESCRIPTION OF THE DRAWINGS

FIG. 2 is a schematic diagram of the fuse circuits of FIG. 1 in accordance with the present invention.

FIG. 3 is a flow diagram illustrating the preferred embodiment of the method of the present invention.

For purposes of clarity and ease in understanding the present invention, like elements will be identified by like reference numerals in the various drawings.

DETAILED DESCRIPTION OF THE INVENTION

Figure 1:
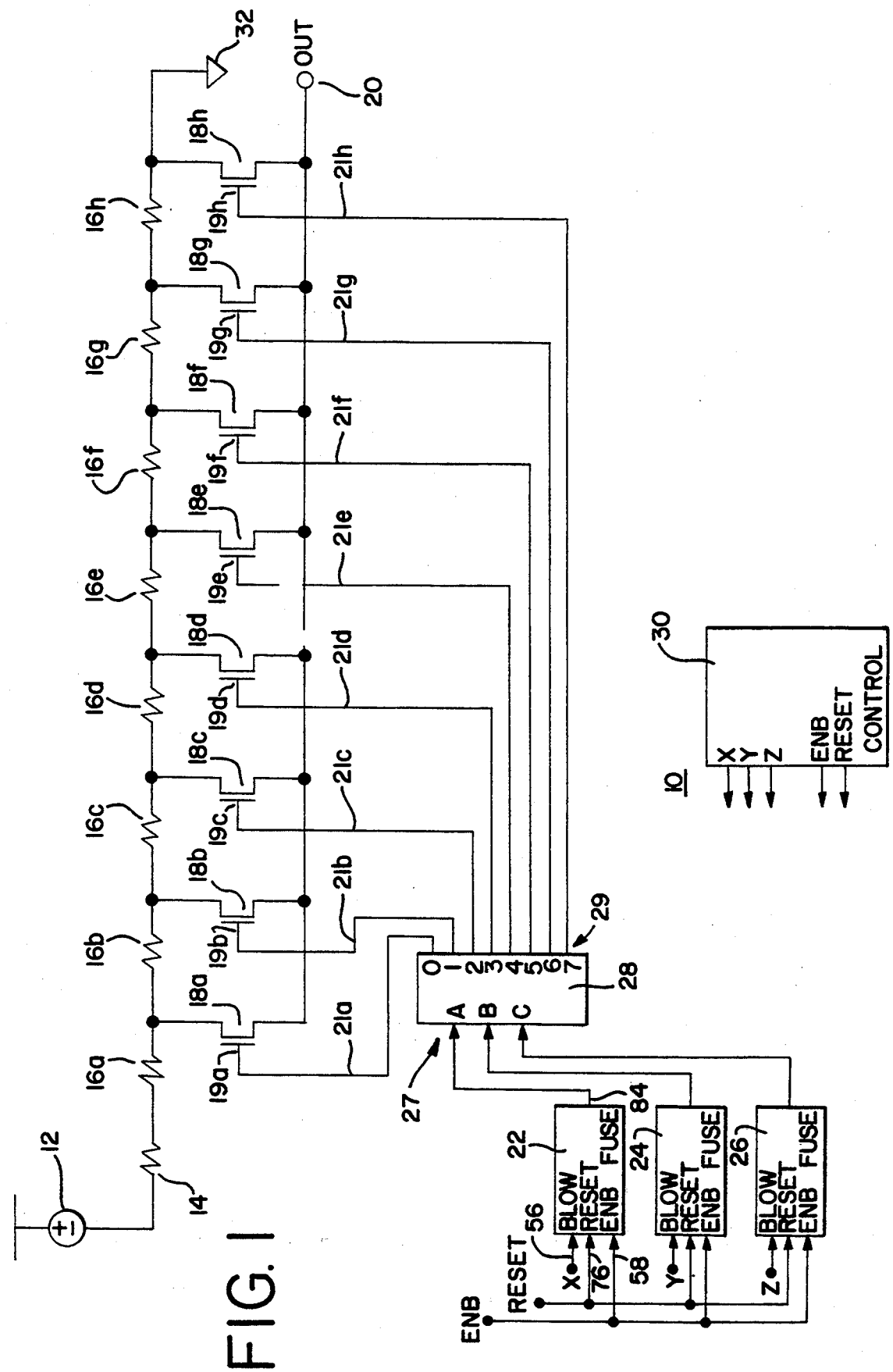
FIG. 1 is a schematic diagram of the preferred embodiment of the apparatus of the present invention.

FIG. 1 is a schematic diagram of a preferred embodiment of the apparatus 10 of the present invention. In the preferred embodiment, the apparatus 10 includes a voltage source 12 coupled through a first resistor 14 and a network of resistors 16a–16h and transistors 18a–18h to an output node 20.

The apparatus 10 further includes a first fuse circuit 22, a second fuse circuit 24 and a third fuse circuit 26. The structure and operation of the fuse circuits will be discussed in detail in conjunction with FIG. 2. Each of the fuse circuits receives as inputs control signals ENB and RESET. In addition, the first fuse circuit 22 receives control signal X as an input; the second fuse circuit 24 receives control signal Y as an input; and the third fuse circuit 26 receives control signal Z as an input.

The apparatus 10 further includes a control circuit 30. The control circuit 30 generates the control signals ENB, RESET, X, Y and Z. The control circuit 30 may be under control of one or more predetermined program instructions for controlling the timing and application of the control signals.

In operation, the voltage source 12 generates a voltage which causes current to flow from the voltage source 12 through first resistor 14 and resistors 16a–16h to the ground node 32. Each of the transistors 18a–18h is responsive to an activation signal supplied by the decoder 28 to the respective gate terminal 19a–19h of the transistor 18a–18h via an activation line 21a–21h. In response to the applied activation signal, the transistor 18a–18h couples its associated resistor 16a–16h to the output node 20. Preferably, each resistor 16a–16h is identical. Further, preferably each transistor 18a–18h is identical. Thus, the potential at the output node 20 may be selected to be any one of eight discrete values between the potential at the ground node 32 and potential produced by the voltage source 12. This voltage may, in turn, be used for setting one or more circuit parameters through circuitry (not shown) coupled with the output node 20.

The decoder 28 is preferably a 3 to 8 decoder of the type well-known in the art. In response to a 3-bit code applied to the decoder inputs 27, the decoder generates at its output 29 an 8-bit output signal, only one bit of which has a logic 1 value. Each bit of the 3-bit code supplied to the input of the decoder 28 is generated by a respective one of the first fuse circuit 22, the second fuse circuit 24 and the third fuse circuit 26.

It is to be understood that the embodiment of the present invention illustrated in FIG. 1 is exemplary only. One skilled in the art will recognize that any number of fuse circuits such as fuse circuits 22, 24 and 26 could be used for generating activation signals for controlling the signal applied to the output node 20. Similarly, any number of decoders such as decoder 28, or no decoder at all, could be used for decoding the activation signals. Further, any appropriate network of resistors and transistors may be used for generating appropriate signal levels at output node 20. The present invention is not limited to the precise circuit illustrated in FIG. 1 or in FIG. 2.

FIG. 2 is a schematic diagram of a fuse circuit used in conjunction with the apparatus 10 illustrated in FIG. 1. In FIG. 2, the fuse circuit 22 includes a fuse 40, a fuse blowing circuit 42, a fuse reading circuit 44 and a disable switch 46. The fuse circuit 22 has a blow input 56, an enable input 58, a reset input 76 and an output 84.

The fuse 40 may be fabricated from any of the conductor layers forming the integrated circuit. Preferably, the fuse is fabricated from first level polysilicon. The fuse should have a relatively low resistance, preferably 200 ohms, so that in response to low levels of applied current, the fuse 40 appears as a short circuit. In response to high levels of applied current, the fuse 40 preferably blows, converting to a high resistance state having a resistance on the order of 20 megohms. The fuse 40 has a first end 41 coupled to a first node 50 and a second end 43 coupled to the ground node 48. Thus, the fuse 40 forms an interrupting means for interrupting a circuit; the fuse 40 establishing a potential at the node 50 within the fuse circuit 22. The fuse 40 thus has an interrupted state for establishing the potential at the node 50 at a first potential level and an uninterrupted state for establishing the potential at the node 50 at a second potential level.

The fuse blowing circuit 42 includes a blow current source 52 and a blow switch 54. The blow switch 54 closes in response to a signal applied to the blow input 56 by the control circuit 30 (FIG. 1). As illustrated in FIG. 2, the blow current source 52 has a single control input 60 coupled to the ENB input 58. The blow current source 52 thus responds to an enable signal supplied to the ENB input 58 by the control circuit 30.

In operation, the blow current source 52 responds to the enable signal at the control input 60 to generate a blow current. The blow current is preferably approximately 15 mA, and the blow current source 52 preferably includes a bipolar transistor (not shown) for supplying a current of this magnitude. The blow current source 52 may also include field effect transistors (not shown) for controlling supply of the blow current. In response to the blow control signal received at the blow input 56, the blow switch 54 closes to couple the blow current source 52 to the fuse 40. Preferably, the blow switch 54 couples the blow current to the fuse 40 for a period of approximately 10 μsec. The blow switch 54 preferably comprises a field effect transistor (not shown). In response to the blow current, the fuse 40 blows, changing from its intact or uninterrupted state to its blown or interrupted state. Thus, the fuse blowing circuit 42 forms a state altering means operatively connected with the fuse 40 for changing the fuse 40 from its uninterrupted state to its interrupted state in response to a first control signal at the blow input 56.

The fuse reading circuit 44 includes an operational current source 62, a test current source 64, a resistor 66 and a comparator 68. The operational current source 62 has a control input 70 coupled to the ENB input 58. In response to a control signal received at the ENB input 58 from the control circuit 30 (FIG. 1), the operational current source 62 supplies a current through the resistor 66 to the fuse 40. This current is preferably approximately 1 $\mu$A. The resistor 66 is preferably approximately 10K ohms, and is preferably a value much larger than the resistance of the fuse 40 when the fuse 40 is in its intact or uninterrupted state.

The test current source 64 has a first control input 72 coupled to the ENB input 58. The test current source 72 also includes a second control input 74 coupled to the reset input 76. As illustrated in FIG. 2, the test current source 72 only supplies a test current when signals at both the first control input 72 and the second control input 74 are at logic level 1. Thus, in response to control signals applied to the reset input 76 and the ENB input 58, the test current source 64 supplies a test current through the resistor 66 to the fuse 40. This current is preferably approximately 100 $\mu$A.

The comparator 68 has a first input 78 coupled to the first end 41 of the fuse 40 at node 50, a second input 80 coupled to a reference voltage source 86, an enable input 88, and an output 82 coupled to the output 84 of the fuse circuit 22. As will be appreciated by those skilled in the art, the comparator 68 compares the voltage at the input 78 with the voltage at the input 80. When the voltage at node 50 supplied to the input 78 is greater than the reference voltage supplied by the reference voltage source 86 to the input 80, the comparator 68 generates a voltage at the output 84 having one value of a first value or a second value. When the voltage at the node 50 is less than the reference voltage supplied by the reference voltage 86, the comparator 68 generates a potential at the output 84 having the other value of the first value and the second value.

The disable switch 46 operates in response to the control signal applied to the ENB input 58. The disable switch 46 preferably comprises a field effect transistor (not shown). When the control signal applied to the ENB input 58 has a value which enables the blow current source 52, the operational current source 62 and the test current source 64, the disable switch 46 opens. When the control signal applied to the ENB input 58 disables the blow current source 52, the operational current source 62 and the test current source 64, so that these current sources do not supply current, the disable switch 46 closes, coupling the node 50 to the ground node 48. In this manner, and in accordance with the present invention, when the fuse circuit 22 is not in operation, and when no current is supplied to the fuse 40 for blowing or reading or testing, the node 50 is electrically coupled through the fuse 40 to the ground node 48. Thus, when the fuse 40 is not being blown, read or tested, a 0 volt potential is maintained across the fuse 40. This eliminates the possibility of fuse regrowth after the fuse 40 has been blown or marginally blown.

The operational current source 62 is used for determining the state of the fuse 40. Preferably, one or more fuses 40 which form the apparatus 10 (FIG. 1) will be blown as part of the manufacturing process. Thereafter, whenever the integrated circuit device (not shown) containing the apparatus 10 is initialized (for example, during power-up), the state of each fuse 40 will be determined, preferably under control of the control circuit 30 (FIG. 1), in response to a predetermined program of instructions. The state of the fuse 40 is determined by enabling the operational current source 62 to apply current through the resistor 66 to the fuse 40. If the fuse 40 is in its intact, uninterrupted state, the node 50 will be at approximately the ground potential of the ground node 48. The comparator 68 will detect that the fuse 40 is intact by measuring the voltage at the node 50. The comparator 68 will supply an appropriate output signal to the output 84 as described above. The output 84 is coupled to the decoder 28 (FIG. 1). The signal at the output 84 may be latched within the decoder 28, as will be understood by those skilled in the art.

The test current source 64 is used for detecting a marginally-blown condition of the fuse 40. In the marginally-blown state, the fuse 40 will have a resistance intermediate the resistance of its intact state, for example 200 ohms, and the resistance of its blown state, for example 20 megohms. In the marginally-blown state, the fuse 40 may have a resistance on the order of 10K ohms. To test for a marginally-blown condition, a control signal is applied to the ENB input 58 to activate the operational current source 62. The operational current source 62 preferably applies a current on the order of 1 $\mu$A to the fuse 40. If the fuse 40 is in a marginally-blown state, this small current will cause the fuse 40 to appear to be blown. Next, a control signal is applied to the reset input 76 to activate the test current source 64. The test current source 64 will apply a current on the order of 100 $\mu$A to the fuse 40. If the fuse 40 is marginally blown, this current will cause the fuse 40 to appear intact. As a result of the marginally-blown state of the fuse 40, the signal applied to the output 84 of the fuse circuit 22 will change in response to application of the control signal at the reset input 76. When such a change is detected, the integrated circuit device (not shown) which contains the apparatus 10 may be discarded.

FIG. 3 illustrates a flow diagram representing the preferred embodiment of the method of the present invention. The method starts at step 100. At step 102, predetermined circuit parameters of the integrated circuit device in which the method of the present invention is used are evaluated. If all of the predetermined circuit parameters are within their respective predetermined tolerance ranges, there is no need to trim the integrated circuit device (i.e., it is not necessary to blow any fuses). In that case, the "NO" branch is taken from step 102 along flow path 104 and the method terminates at step 126. If one or more circuit parameters are outside a predetermined tolerance range, the "YES" branch is taken from step 102 and flow path 106 is taken.

The method continues at step 108, where the control circuit 30 (FIG. 1) enables the fuse circuits 22, 24 and 26. The control circuit 30 enables the fuse circuits 22, 24 and 26 by applying a control signal at the ENB inputs 58 (FIG. 2) of the respective fuse circuits 22, 24, 26. The method continues at step 110, where the control circuit 30 blows selected fuses 40 by applying control signals at the blow inputs 56 of selected fuse circuits 22, 24, 26.

At step 112, a control signal is applied to the ENB inputs 58 of the respective fuse circuits 22, 24, 26 to enable the operational current sources 62 of the respective fuse circuits 22, 24, 26 and allow the comparators 68 of the respective fuse circuits 22, 24, 26 to detect the state of the fuses 40 of the respective fuse circuits 22, 24, 26. At step 114, a control signal is applied to the reset input 76 of the respective fuse circuits 22, 24, 26, causing the test current sources 64 of the respective fuse circuits 22, 24, 26 to apply the test current to the respective fuses 40. At step 116, the comparators 68 detect the state of the respective fuses 40. At step 118, if a change is detected between the value generated by each of the fuse circuits 22, 24, 26 in response to the operational current and in response to the test current, the "YES" branch is taken from step 118, the flow path 120 is followed, and the integrated circuit device is rejected as being nonfunctional. If no such change is detected, the "NO" branch is taken, and the flow path 122 is followed. At step 124, the control signal supplied to the ENB inputs 58 of the fuse circuits 22, 24, 26 is deasserted, causing the respective disable switches 46 of the fuse circuits 22, 24, 26 to close, removing the applied voltages from each of the respective fuses 40. The method terminates at step 126.

As can be seen from the foregoing, the present invention provides a method and apparatus for use with an electrical circuit for selectively coupling a plurality of circuit branches (including resistors 16a–16h) with an output node 20. One or more fuses 40 may be converted from an uninterrupted state to an interrupted state to generate activation signals for selectively coupling the circuit branches (including resistors 16a–16h) with the output node 20. The invention has particular utility when used in conjunction with an integrated circuit device encapsulated in a plastic package, in that fuses 40 in the integrated circuit device may be blown after encapsulation, using only on-chip circuitry. In addition, the present invention allows testing to determine a marginally-blown condition of on-chip fuses 40. Devices having such marginally-blown fuses 40 may be discarded to eliminate reliability problems due to fuse regrowth. Also, the present invention provides for shorting the first end 41 and the second end 43 of all fuses 40, except during fuse blowing and fuse reading operations, to eliminate the possibility of fuse regrowth.

It is to be understood that, while the detailed drawings and specific examples given describe preferred embodiments of the invention, they are for the purpose of illustration, that the apparatus of the invention is not limited to the precise details and conditions disclosed and that various changes may be made therein without departing from the spirit of the invention which is defined by the following claims:

What is claimed is:

1. A method for selectively coupling at least one of a plurality of circuit branches with an output node, each respective circuit branch of said plurality of circuit branches including a respective switching element of a plurality of switching elements, said respective switching element being responsive to a respective activation signal of a plurality of activation signals to electrically couple said each respective circuit branch with said output node, each said respective switching element coupling said respective circuit branch with said output node when said respective activation signal has a first value and each said respective switching element decoupling said respective circuit branch from said output node when said respective activation signal has a second value, the method comprising the steps of:

providing an electrically interruptible circuit element, said interruptible circuit element establishing a potential at a locus, said potential being at a first potential level when said interruptible circuit element is in an interrupted state, said potential being at a second potential level when said interruptible circuit element is in a noninterrupted state;

detecting said potential at one of said first potential level or said second potential level;

generating a code at one value of a first value and a second value when said potential is at said first potential level, and generating said code at the other value of said first value and said second value when said potential is at said second potential level;

decoding said code to generate said plurality of activation signals; and applying a test signal to said electrically interruptible circuit element, generating said code at a first test value, applying an operational signal to said interruptible circuit element, generating said code at a second test value, and comparing said first test value and said second test value.

2. A method for selectively coupling at least one of a plurality of circuit branches with an output node as recited in claim 1 wherein said test signal comprises a first current and said operational signal comprises a second current.

3. A method for generating a code for controlling a circuit, the method comprising the steps of:

providing an electrically interruptible circuit element, said electrically interruptible circuit element having a first terminal and a second terminal, said electrically interruptible circuit element establishing a potential between said first terminal and said second terminal, said potential being at a first potential level when said electrically interruptible circuit element is in an interrupted state, said potential being at a second potential level when said electrically interruptible circuit element is in a noninterrupted state;

detecting said potential at one of said first potential level or said second potential level;

generating said code at one value of a first value and a second value when said potential is at said first potential level, and generating said code at the other value of said first value and said second value when said potential is at said second potential level; and after generating said code, establishing said potential at a third potential level.

4. A method for generating a code as recited in claim 3 wherein the method further comprises the step of coupling said first terminal with said second terminal in response to a control signal, and wherein said establishing step comprises the step of providing said control signal.

5. A method for generating a code as recited in claim 4 wherein said coupling step comprises establishing said potential at substantially 0 volts.

6. A method for generating a code as recited in claim 3 wherein the method further comprises the step of applying a test signal to said electrically interruptible circuit element, generating said code at a first test value, applying an operational signal to said interruptible circuit element, generating said code at a second test value, and comparing said first test value and said second test value.

7. A method for generating a code as recited in claim 6 wherein said test signal comprises a first current and said operational signal comprises a second current.

* * * * *